United States Patent [19]

Garcia et al.

[11] Patent Number: 5,481,550
[45] Date of Patent: Jan. 2, 1996

[54] APPARATUS FOR MAINTAINING STIMULATION TO A DEVICE UNDER TEST AFTER A TEST STOPS

[75] Inventors: Rodolfo F. Garcia, San Jose; Egbert Graeve, Los Altos, both of Calif.

[73] Assignee: Schlumberger Technologies, Inc., San Jose, Calif.

[21] Appl. No.: 134,330

[22] Filed: Oct. 12, 1993

Related U.S. Application Data

[63] Continuation-in-part of Ser. No. 53,639, Apr. 27, 1993, abandoned.

[51] Int. Cl.[6] .................................................. G01R 31/28
[52] U.S. Cl. ...................... 371/27; 371/22.6; 371/578; 364/481; 395/750
[58] Field of Search .............................. 371/27, 23, 5.5, 371/18, 22.6, 21.3; 324/158 R; 365/201; 395/750; 364/481, 707

[56] References Cited

U.S. PATENT DOCUMENTS 5,203,003  4/1993  Donner ..................................... 364/707

OTHER PUBLICATIONS

"Automatic Testing and Evaluation of Digital Integrated Circuits", James T. Healy, Reston Publishing Co, Inc., Reston, Virginia 22090, 1981, p. 8.

Primary Examiner—Emanuel T. Voeltz
Assistant Examiner—Kamini Shah
Attorney, Agent, or Firm—Townsend and Townsend and Crew

[57] ABSTRACT

A Device Under Test ("DUT") is monitored to determine when a test stops due to failure, completion, or otherwise. A series of signal stimulus in the form of a maintain active signal are applied to the DUT after the test has stopped. This protects devices that need continuous functional stimulus while connected to a power source. Upon the resumption of the test, the maintain active signal stimulus is synchronously replaced with an input test signal stimulus.

27 Claims, 9 Drawing Sheets

APPARATUS FOR MAINTAINING STIMULATION TO A DEVICE UNDER TEST AFTER A TEST STOPS

This is a continuation-in-part of application Ser. No. 08/053,639, filed Apr. 27, 1993 now abandoned.

BACKGROUND OF THE INVENTION

The present invention relates to automatic test equipment for testing integrated electronic circuits and, more particularly, to those test systems testing advanced high performance devices such as RISC electronic circuits or electronic circuits with Phase Locked Loops ("PLL").

With the development of new, superpipelined high performance RISC processors, such as Digital Equipment Corporation's 21064 (also known as the Alpha AXP) and MIPS' R4000/4400 processors, new problems concerning the testing of these devices have surfaced. These devices cannot tolerate having power applied to them without any functional stimulus input. Applying power to these devices without any functional stimulus input can force these devices into a catastrophic high power dissipation mode, causing severe damage to the internal circuitry of the device under test. This problem was never experienced with the LSI/VLSI devices prior to these high performance devices. The above situation can be better understood by explaining the operation of modern LSI/VLSI testers.

In modern LSI/VLSI testers, when a functional test is initiated, the test vectors stored in the tester's local memory are executed beginning at some programmed start location. The test vectors are formatted and timing is applied from the timing generators. Thereafter, the timed, formatted test vector is applied to the device under test. When a functional failure occurs, the functional test is typically aborted, which means that no further stimulus is applied to the device. In some testers, equipped with a special error capture memory, the failure can be logged into the capture memory and testing can continue uninterrupted. In either case (i.e., with or without capture memory), when the last test vector in the truth table is executed, the application of any further test vectors is stopped (i.e. no further stimulus is applied to the device). At this point, if power is not quickly removed from the class of devices mentioned above, the device would be damaged by the test system.

During device testing and/or characterization, there are many situations where a perfectly good device will fail a functional test. For instance, this frequently happens when performing a speed sorting of devices when the test program attempts to run the functional test at the highest speed bin required. If the device is not fast enough, it will fail at some random point during the functional test.

One way to solve the above problem is to disconnect the power to the device under test. However, this solution may not be feasible in many instances. For example, when performing a timing margin characterization or a shmoo plot on a device, many functional failures are generated on a good device while the test system is converging upon the pass/fail boundary of device operation. In this case, a 512×512 points shmoo plot requires that 262,144 separate functional tests be performed on the device. For the class of devices mentioned above, that many power up/power down cycles would be required so as to not damage the device. If we assume that it requires 1 millisecond to perform a power up, or a power down cycle, the shmoo plot would require almost 9 minutes of tester time for cycling power on the device under test. Clearly, this results in a very high amount of unproductive and wasted time which adds to the overhead cost of testing operations.

Currently, none of the existing testers address the above problem in entirety. However, distantly related features have appeared in prior generations of ATE systems to solve other testing problems.

For instance, the Fairchild Sentry 600 line of testers (presently owned by Schlumberger Technologies, Inc., the present assignee) include a mode whereby the test program could define a "minor loop" of test vectors as illustrated in prior art FIG. 1. FIG. 1 illustrates a local memory 30 which stores a series of test vectors to be applied to the device under test ("DUT"). The program will load a start address register 34 to indicate a start of the test at an address location 32. The program will specify a minor loop between address locations 36 and 40 at some predefined period in a program. This minor loop is reached through sequential execution, as illustrated by line 38.

A typical use for such a minor loop is when older PMOS and NMOS microprocessors were tested. The test program would run through a first series of test vectors, and then would want to reload another series. During the reloading, the minor loop maintains signal stimulus to the internal memory of the PMOS and NMOS devices so that they do not lose their state. When the new test vectors have been loaded in, the test program will cause the minor loop to be exited by loading a value into an appropriate mode register, which is then operative on the next clock cycle in the test. After the minor loop is exited, the test vectors are executed again until address 42 specified by stop address register 44 is reached to indicate the end of the test.

Additionally, devices which incorporate phase lock loops ("PLLs") can also use this capability, so as to keep the PLL frequency from drifting while new test vectors are being loaded into the pattern memory.

It should be noted that the "minor loop" function can only be activated if the test vector execution reaches the beginning location of the loop. If the test vector execution does not somehow reach these locations (i.e., the device under test fails at an earlier location), then the test pattern never enters into this loop. Newer test system architectures now allow for either multiple loop locations, or the indefinite repetition of single vectors to accomplish the same functions. However, it is still necessary to have the test vector execution reach the locations of these loops or single vector repeats. In this system, once the "minor loop" is invoked, local memory is available for modification by the test program, but the timing system continues to be used and therefore new program values cannot be entered into the timing generators.

A second system uses a second scheme incorporating a "Free Running Clock" ("FRC") 50, as shown in prior art FIG. 2. This scheme was first developed and used on the Schlumberger S20/S21 series of testers. The FRC 50 is applied to the clock input of the DUT through multiplexing circuitry 52. The timing values in memories 54 are applied to the pins through timing generators 56 under the control of a test period generation circuit 58, which is in turn programmed by a test period memory 60. After a functional test is run, the memories 54 are reloaded with DC parametric tests to be applied to the DUT. The FRC continues to run to apply clock signals to the DUT, which are needed for running the DC tests. Since the FRC is now unsynchronized with any test vectors, if a new functional test was to be applied (as opposed to a DC test), the whole system would have to be shut down and restarted. There is no provision for resuming from the last state the DUT was in, since the FRC is unsynchronized after the first functional test ends. The FRC 50 is started coherently with the timing generators 56 on the beginning of the functional test, but after the functional test ends, there is no longer synchronization. This sharply curtails the use of an FRC. Generally, in this system, the local memory is also available for program modifications, as well as all of the timing generators, except for the FRC generator which cannot be reprogrammed since it is being utilized.

On the other hand, the present invention offers a new tester feature which is not offered by the existing ATE systems. The present invention is designed to address the above problems in testing the latest generation of high performance RISC processors. The invention enables a test system to maintain functional input stimulus to a device under test, while it is reprogramming a new test sequence or while it is addressing a device failure. This is done in a manner that is synchronized with the regular functional tests applied to the device under test.

SUMMARY OF THE INVENTION

The present invention is directed to a method and apparatus for maintaining the stimulus to a device under test ("DUT") after the current test is stopped. The present invention detects the impending stop of the current test and provides a series of signal stimulus ("maintain active" signal stimulus) to prevent DUT destruction. Once the tester system is ready to continue testing the device, the maintain active sequence is replaced with the test sequence in a synchronized manner in response to a resume signal.

The present invention enables automatic tester systems to prevent device destruction when power is applied to the DUT without any other stimulus signals. In a preferred embodiment, the invention detects whether stimulus signals to the DUT have stopped by detecting three events: (1) a current test is completed (Halt), (2) a programmable halt is executed (Halt), or (3) a device has failed the test (Fail). Upon detecting any of these events, the present invention applies the maintain active signal stimulus to the DUT. Meanwhile, if a new test must be run, the present invention allows either the loading of the system with the new test sequence or the accessing of a new test sequence already existing in the memory of the system. Once the system is ready to resume testing, it synchronously replaces the maintain active signal sequence with the test sequence in memory and continues.

In the preferred embodiment, each pin has an Event Sequence Store Memory ("ESS") which supplies edge and timing information representing four events at a time to a data register. A formatter interprets the data clocked out of the register and combines it with test vectors from a pattern memory to apply a signal sequence to the DUT. Upon detection of an enabled maintain active condition, a series of "maintain active" timing signals are generated to sequence into the maintain active state. A maintain active sequence is loaded from the Event Sequence Store Memory into the data register, and the clocking of new data into the register is disabled, so the sequence will continuously repeat. Control of the ESS address input is then switched to a CPU for reloading, if needed. The entering into and exiting from a maintain active state is synchronized with the test sequence both on entering and exiting the maintain active state.

Hence, it is the objective of this invention to provide a method for maintaining stimulus to a DUT once a current test is stopped and the power is still connected. This enables the tester system to prevent damaging devices that require functional stimulus while the power is applied to them.

It is a further objective of the present invention to provide a method that reduces the cost of testing the above mentioned devices by eliminating the need for a massive number of power up/down operations.

It is another objective of the present invention to provide a method of preventing the frequency drifting of a PLL when testing active devices that encompass PLL.

For a fuller understanding of the nature and advantages of the invention, reference should be made to the ensuing detailed description taken in conjunction with the accompanying drawings.

DESCRIPTION OF THE PREFERRED EMBODIMENTS

Figure 1:
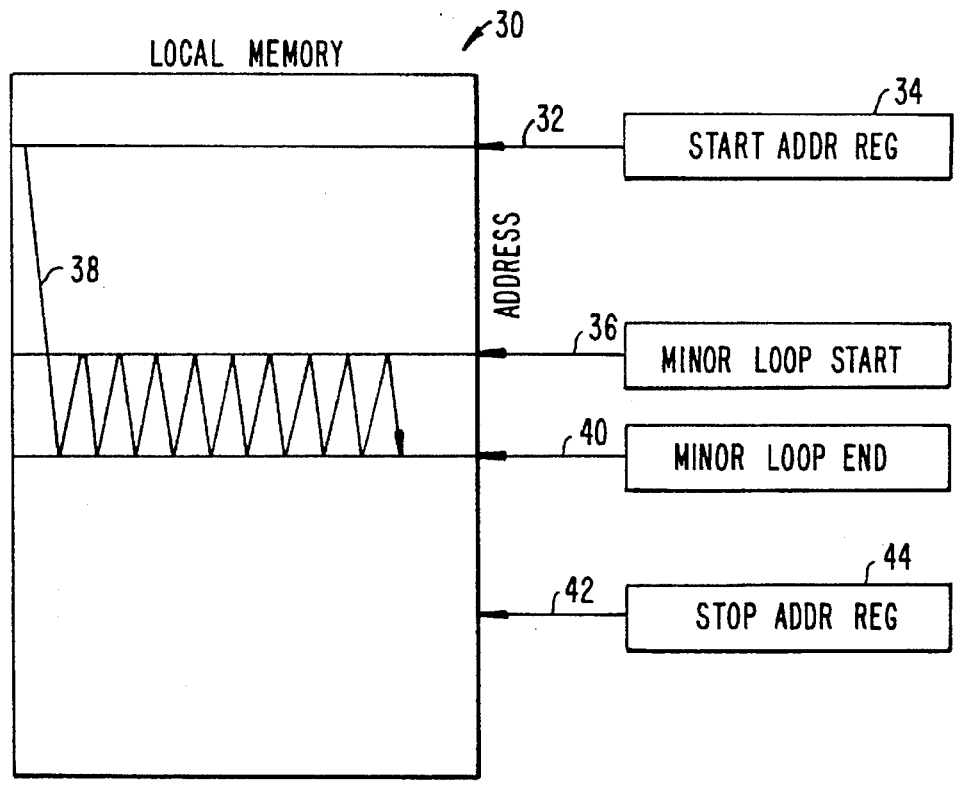
FIG. 1 is a diagram of a minor loop for the prior art Sentry 600.
Figure 2:
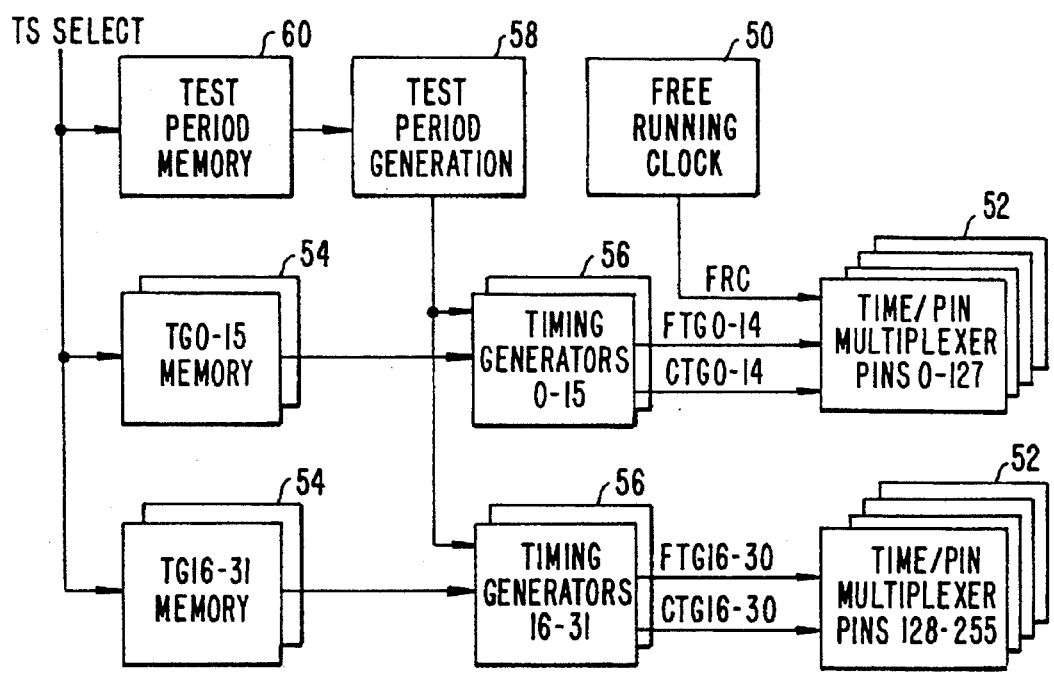
FIG. 2 is a diagram of the prior art free running clock circuitry.
Figure 3:
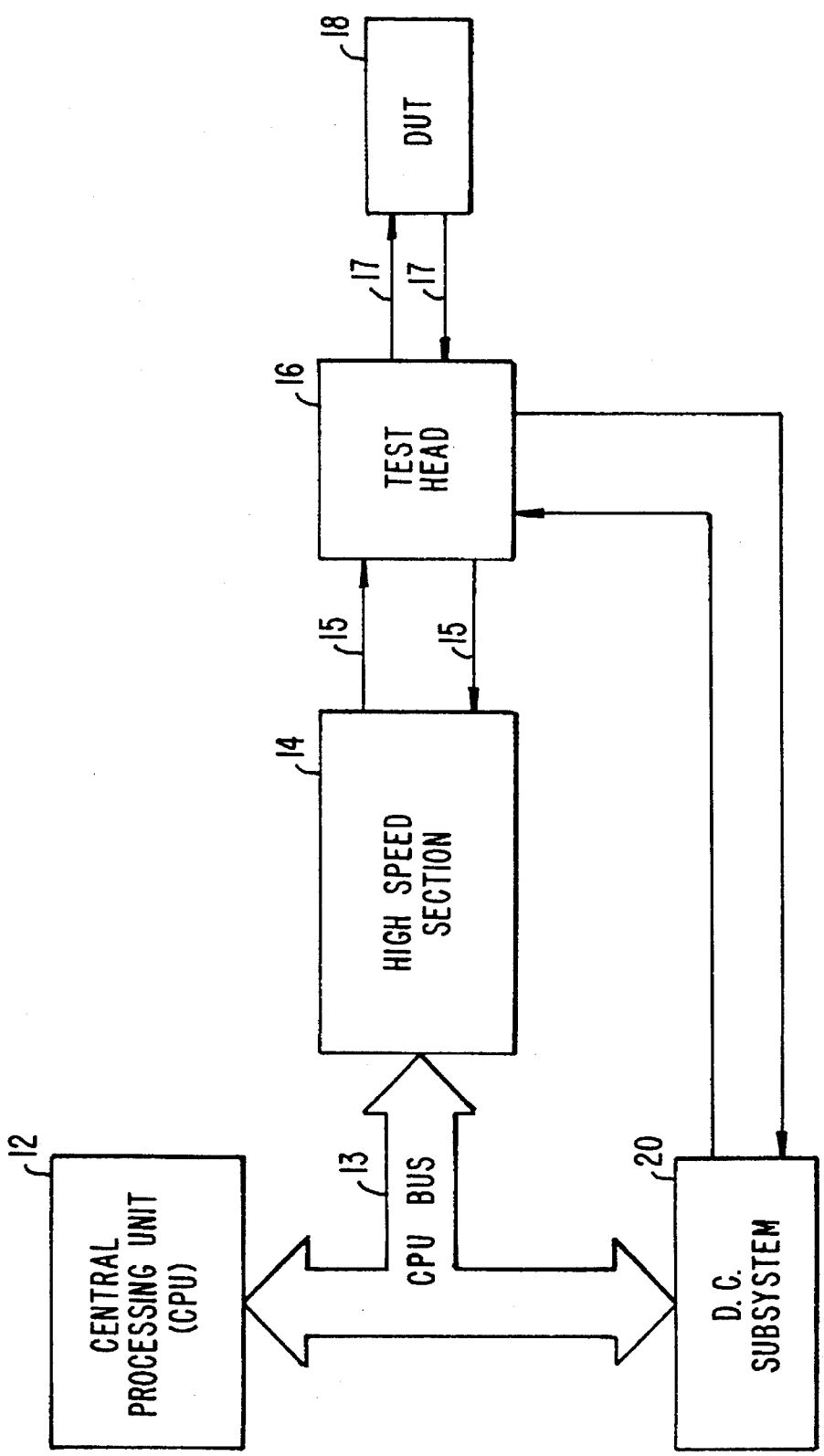
FIG. 3 is a block diagram of a prior art generic Automatic Test Equipment (ATE) system.

FIG. 3 is a block diagram of a generic prior art ATE system 10. This system has a central processing unit (CPU) 12, a high speed section 14, a test head 16, and a DC subsystem 20. CPU 12 controls the overall operation of the ATE system. It communicates with high speed section 14 via CPU bus 13 and provides various control signals and test vectors to the high speed section to run a test. High speed section 14 applies different test vectors to the test head 16 via lines 15. The test head in turn supplies a stimulus signal to the DUT on pins 17. Moreover, it receives the response of DUT to the test vectors via test head 18. For example, if DUT 18 fails a test, a response signal indicative of the failure will be sent to the high speed section for further consideration.

Figure 4:
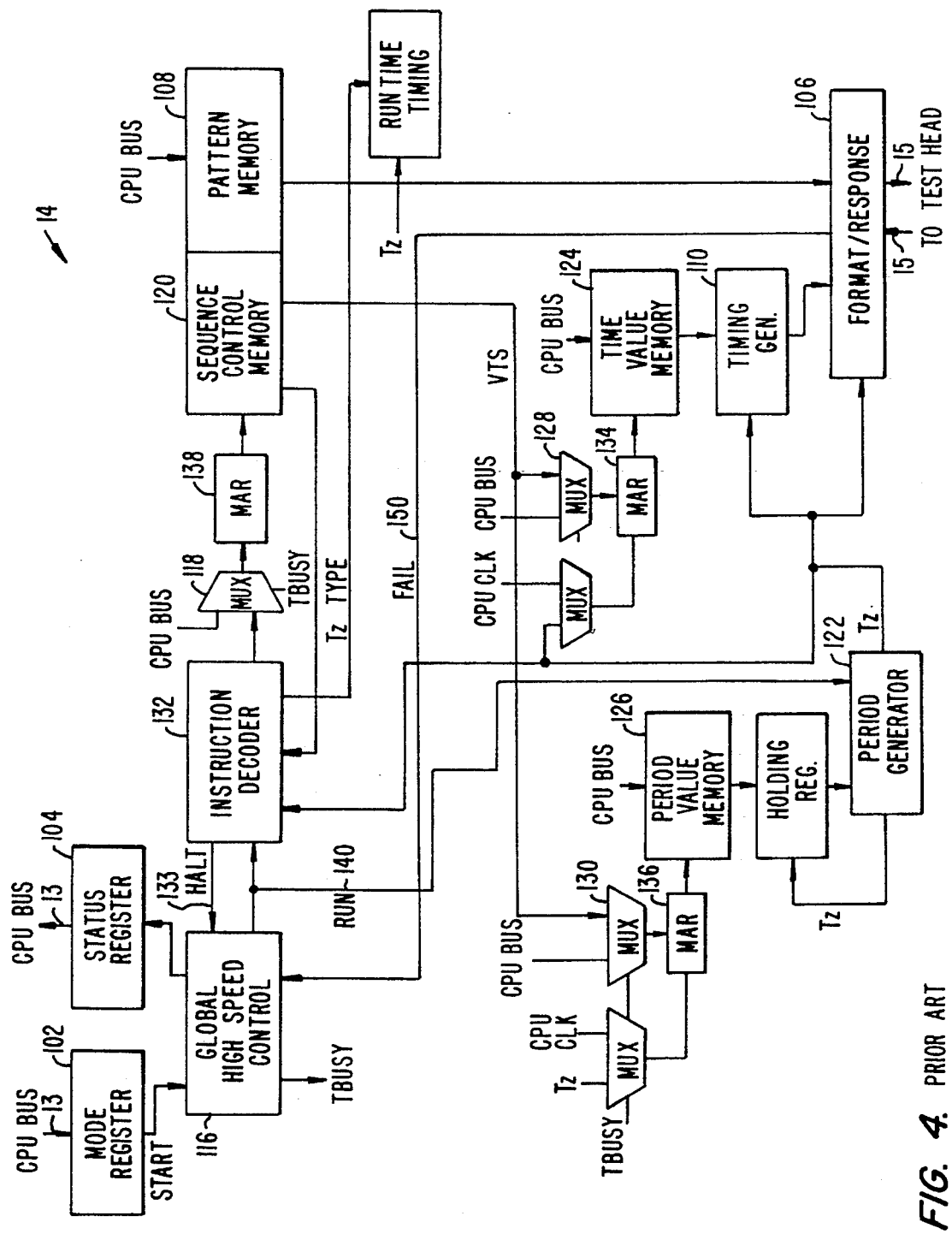
FIG. 4 is a block diagram of the generic high speed section of the ATE system of FIG. 3.

FIG. 4 is a simplified block diagram of the high speed section 14 of FIG. 3. The CPU communicates with mode register 102 and status register 104. It sends the information about the type of functional test to be executed (i.e. Mode Bits) to mode register 102. In addition, a bit indicating the start of a test may also reside in mode register 102. On the other hand, status register 104 provides the CPU with the status of the high speed section 100. For example, if a functional test is executing, a bit in status register 104 would normally show a "tester busy" (TBUSY) status, or if a "match mode" test is being executed, a bit in the status register 104 would show if the match was found, or not.

Additionally, when the functional test ends, status register 104 holds the information indicating the reason for the halt in the testing process. If a device failure stops the current test, the entire failure information will be stored in other parts of high speed section 100.

Each pin of DUT 18 of FIG. 3 has an individual format/response block 106, as shown in FIG. 4. Pattern data from pattern memory 108 (or any other pattern source) and timing/formatting information from timing and period generators 110 and 122, respectively, are applied to the DUT through format/response block 106. In addition, format/response block 106 receives the response of the DUT to the test vectors and communicates it to high speed section 14 of FIG. 3. The system of FIG. 4 combines the waveform formatting and timing information for the test vectors, however, other systems separate the waveform formatting and timing information. In these systems, the formatting information may be contained in dedicated hardware that is separate from the timing generators.

Format/response block 106 of FIG. 4 sends the formatted data to test head 16 of FIG. 3 to be applied to DUT 18. Format/response block 106 further receives from pattern memory 108 the theoretical response of the DUT to compare with the actual response of the DUT to the test vectors. If the generated response does not match the theoretical response for any DUT pin, format/response block 106 sends a "Fail" signal on line 150 to a Global High Speed Control 116 for processing.

Memory Address Register ("MAR") 138 contains the location of the individual pattern vectors to be applied to the DUT. This is assuming that the vector is coming from pattern memory 108. Otherwise, where the patterns are generated by an algorithmic pattern generator, MAR 138 would point to the next algorithmic instruction for use by the Algorithmic Pattern Generator ("APG"). Such APGs are used to test VLSI devices with a large memory capacity. However, it is immaterial to the present invention where the pattern is generated.

Associated with pattern memory 108 is sequence control memory 120. It contains non-pattern information which specifies the context in which the pattern vectors are to be used, as well as additional information required for proper vector execution. For example, some fields in the sequence control memory may define that the current vector must be executed "M" times before advancing to the next vector, or that a conditional or an unconditional branch exists in the vector stream, etc. This part of the content of sequence control memory 120 acts as "microcode" for the high speed section of the system and is decoded by Instruction decoder 132.

Sequence control memory 120 also contains vector type select "VTS" information. This information determines which one of the pre-stored timing/formatting information stored in time value memory 124 and period value memory 126 will be forwarded to timing generators 110 and/or period generator 122. This allows the timing system to provide a different setting (for each test) for use by the format/response unit 106. The capability of providing different settings is commonly known as "time switching on-the-fly."

Some system architectures, such as the ITS 9000 manufactured by Schlumberger Technologies, Inc., the present assignee, provide for a one for one mapping between the pattern memory 108 and sequence control memory 120. Other systems realize that the information held in sequence control memory 120 is rather sparse and allocate fewer memory locations for sequence control memory. This requires a logical mapping between pattern vectors and Sequence Control information, such that during each functional test interval an effective sequence control word is defined, along with a pattern vector.

The system of FIG. 4 functions in the following manner. The CPU loads MAR 138 with the address of the first test vector. Then, the CPU writes the start bit into mode register 102 to start the test. This initiates the transfer of VTS information addressed by the content of MAR 138 from sequence control memory 120 to MARs 134 and 136. MARs 134 and 136 use the information to address the proper timing information in time value memory 124 and period value memory 126 that is forwarded to time and period generators 110 and 122, respectively. Next, global high speed control 116 generates a "RUN" signal on signal line 140. This signal is provided to instruction decoder 132 and period generator 122. Upon receiving this signal period generator 122 generates the time zero (TZ) signal, indicating the start of the period for the test vector. During the test, the TBUSY signal, which is provided to the control input of multiplexers 118, 128, and 130, is asserted such that it blocks CPU access to the MARs of high speed section 114.

The testing process continues until global high speed control 116 receives a signal to stop the test, such as a HALT signal on line 133 or a FAIL signal on line 150. There are a number of causes for stopping the operation of an ongoing test, one of which is the DUT failing the test. In one type of system, in case of a failure, the functional test ends as soon as the first failure for any device pin is recognized by high speed section 114. Other systems may allow for an "accumulate errors" mode, in which case, the system would have a "capture memory" to capture the failing information for the pins under test. Global high speed control 116 monitors a logical "OR" of all the FAIL signals from all of the format/response units. If a FAIL signal is asserted, global high speed control section 116 recognizes the existence of a failure and stops any further application of functional test vectors to DUT 112. When this happens, to prevent any device destruction, stimulating signals must be applied to DUT 112. To achieve this, the system must be modified according to the teachings of the present invention, as shown in FIG. 5.

Generic Maintain Active Tester.

Figure 5:
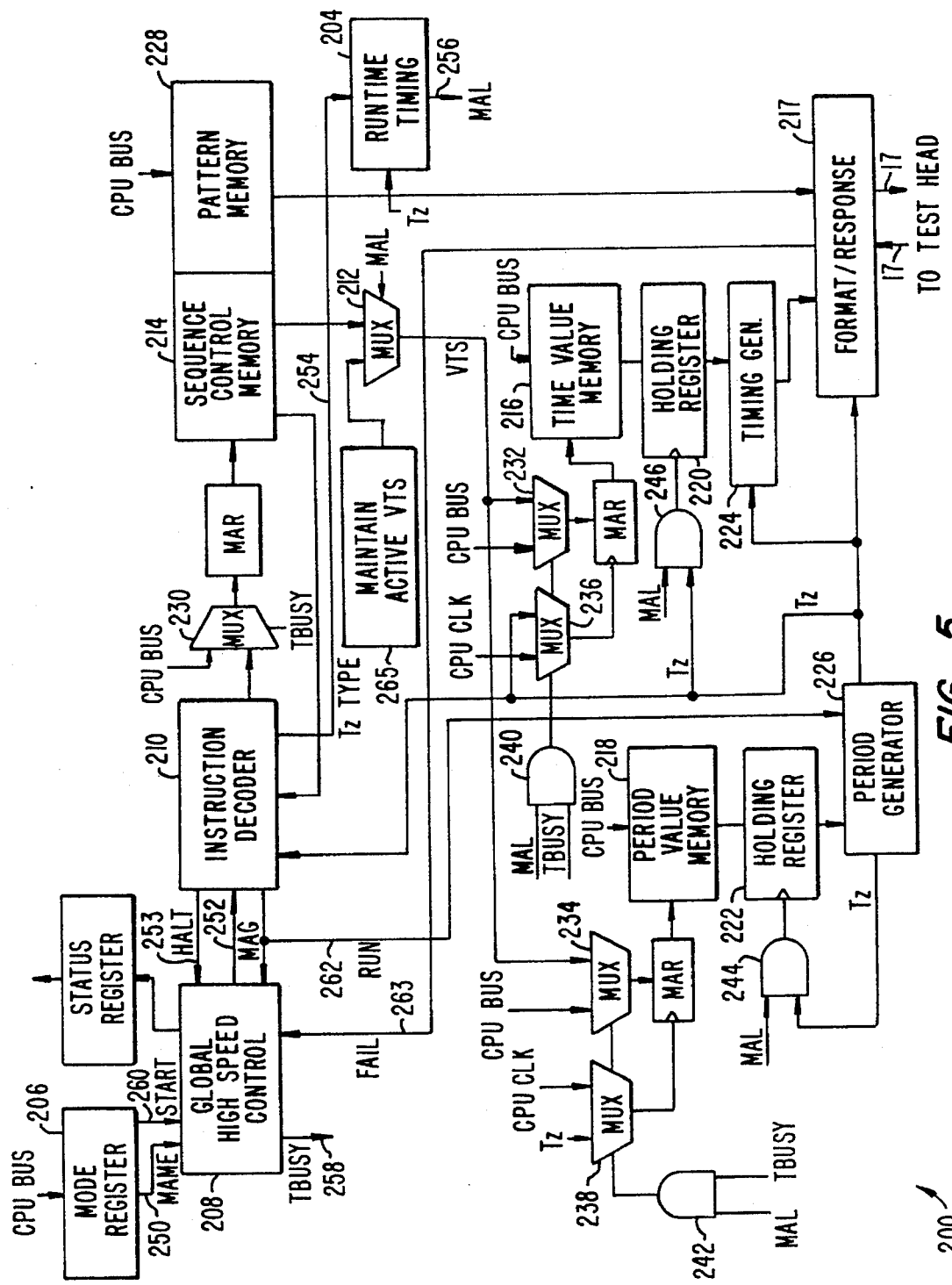
FIG. 5 is a block diagram of the high speed section of FIG. 4 modified according to the present invention.
Figure 9:
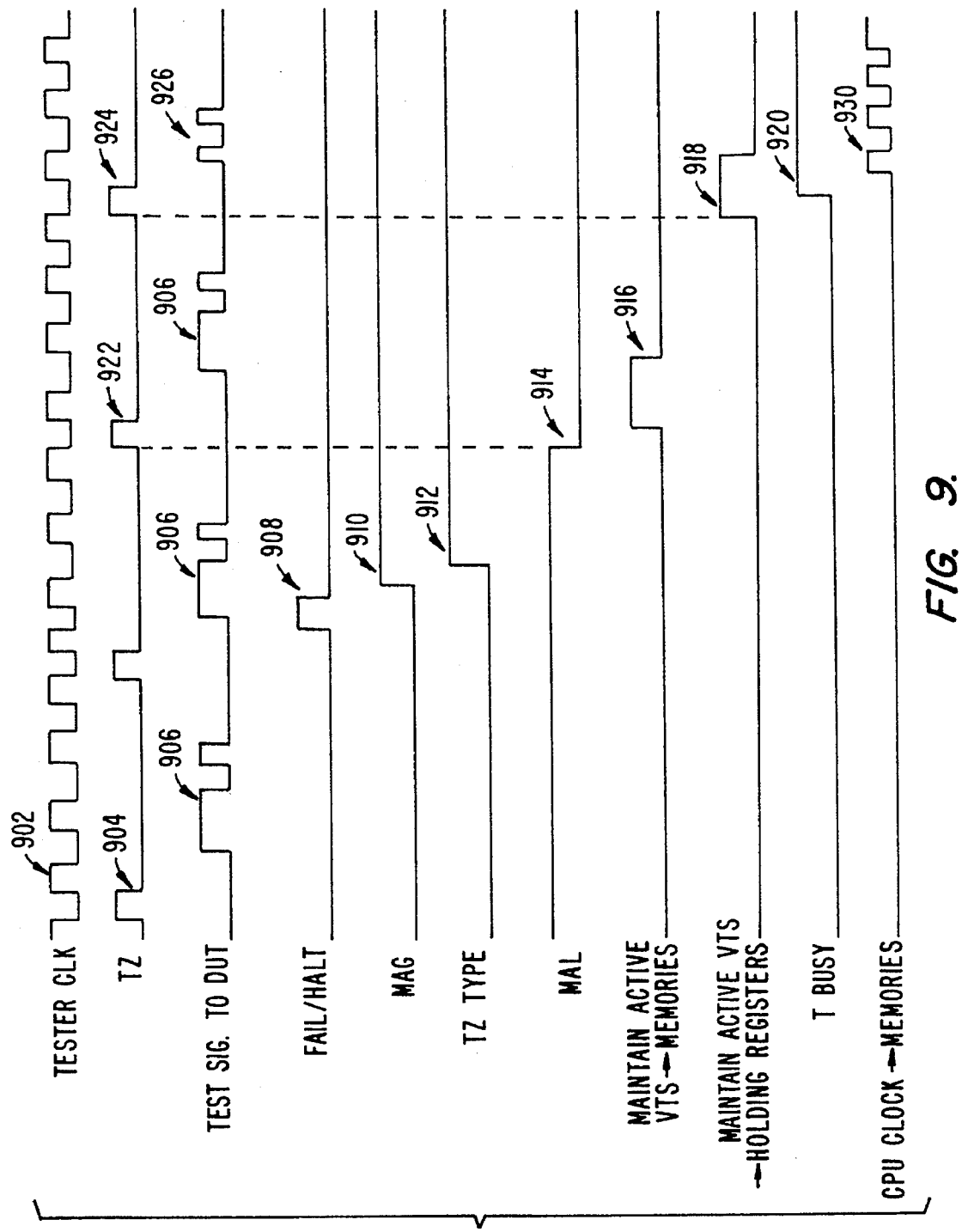
FIG. 9 is a timing diagram illustrating the synchronous transition into the maintain active mode for the circuit of FIG. 5.
Figure 10:
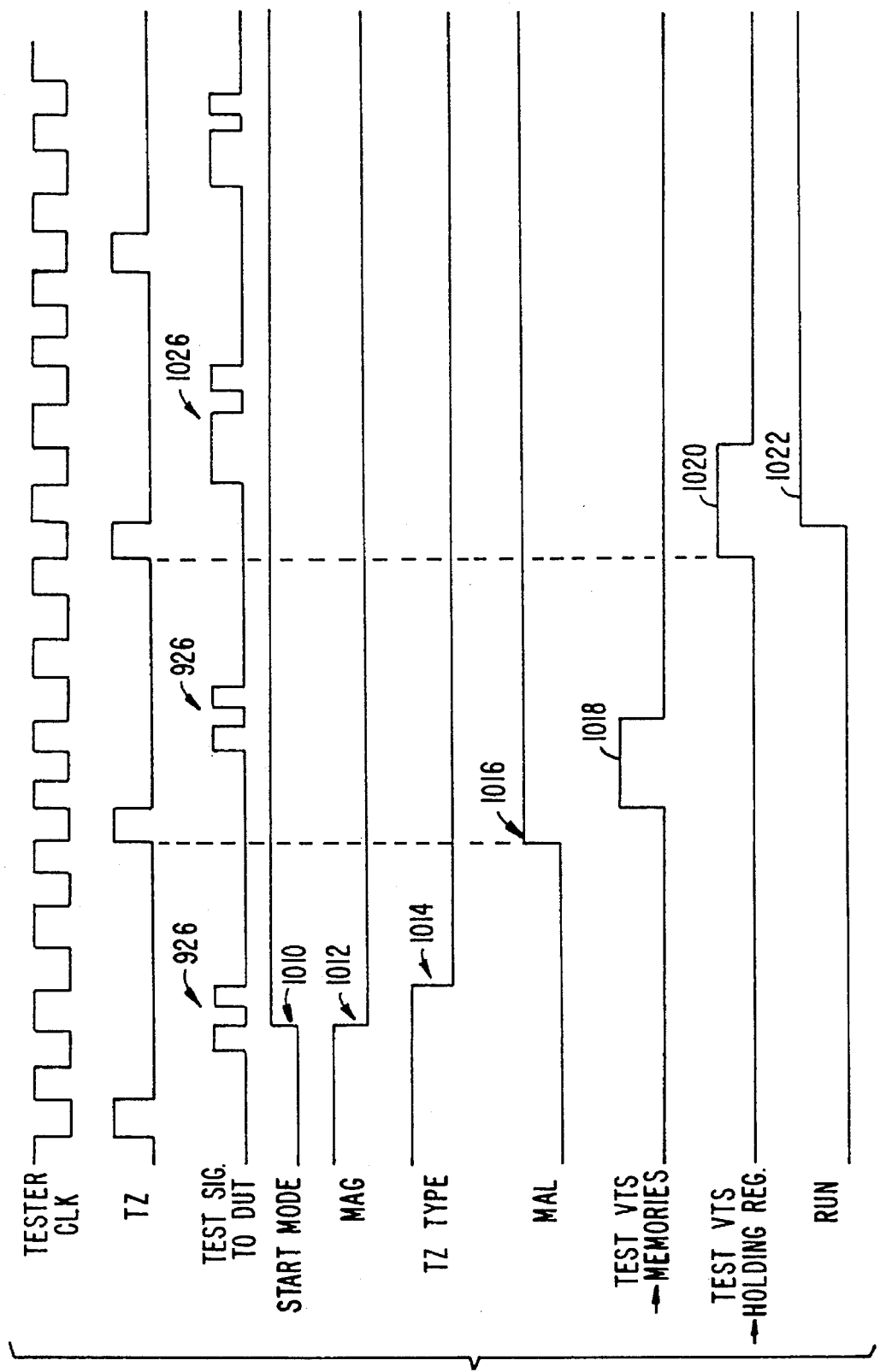
FIG. 10 is a timing diagram illustrating the synchronous transition out of the maintain active mode for the circuit of FIG. 5.

FIG. 5 shows the generic high speed section of FIG. 4 modified to implement the present invention. This modification enables the system to continue stimulating the DUT when the normal operation of the system is ceased. In addition to the elements of high speed section 14 in FIG. 3, high speed section 200 of FIG. 5 uses runtime timing circuit 204, holding registers 220 and 222, multiplexers 212, 236 and 238, and "AND" gates 240 through 246 to implement the present invention. Runtime timing circuit 202 provides a series of sequential timing signals to provide a pipelined, synchronized transition into and out of the maintain active mode in hitch speed section 200. FIGS. 9 and 10 are timing diagrams illustrating this transition. Furthermore, a new signal bit, "Maintain Active Mode Enable" (MAME) is added to the mode register 206 to enable the system to determine whether it desires the maintain active function for any particular test (such as when a RISC processor is being tested). Mode register 206 transfers this information to global high speed control 208 via signal line 250.

As shown in FIG. 9, a clock signal 902 is generated by the tester system, with particular test periods being indicated by a time zero (TZ) signal 904. During each test period, a particular test signal such as signal 906 is applied to each pin of the DUT. This can be a single pulse, a series of pulses of differing width, etc. The maintain active mode can be entered upon the detection of a fall or halt signal, shown as signal 908, as discussed above. (Note that although many signals are shown as pulses in FIG. 9, they could be a multi-bit code or other signal, with the timing diagram intended to illustrate the timing, not the particular values of the signals.)

High speed section 200 enters the maintain active mode of operation if one of the following conditions are met: the DUT fails to respond as expected by the system (FAIL); a successful completion of the current functional test (HALT); or instruction decoder 210 fetched a programmed HALT instruction from sequence control memory 214 (HALT—where the programmer desires the test to stop temporarily for any number of reasons). An example of a FAIL is where the DUT fails to respond properly to a "Match mode" type of functional test, which denotes the failure of the device to respond correctly to a match sequence, and no capture memory is used or the programmer desires to have the test stop instead of storing the "no match" information.

When one of these conditions occurs, global high speed control circuit 208 will receive either the HALT signal or the FAIL signal shown in FIG. 5. on lines 253 and 263, respectively. Global high speed control circuit 208 generates a "maintain active global" (MAG) signal on line 252 (signal 910 in FIG. 9). Responding to the MAG signal, instruction decoder 210 generates a special type qualifier signal for the tester cycles, called "TZ Type," on line 254 (signal 912 in FIG. 9). This signal tells the other elements in the high speed section whether the system is in normal mode or maintain active mode, i.e., the context in which the Tz signals are to be interpreted. Upon detecting the Tz Type signal on line 254, Runtime timing 204 generates a "maintain active local" (MAL) signal on line 256 (signal 914 in FIG. 9). This signal is an active low signal which is used to propagate the necessary information through high speed section 200 for a maintain active operation.

The high speed section of FIG. 5 uses the MAL signal on line 256 to prevent the application of the regular test vectors and to allow the application of the maintain active test vectors., When the test system enters the maintain active mode, the VTS (vector type select) for the regular functional tests (in Sequence Control Memory 214) must be replaced with a prestored and user defined maintain active VTS in a register 265. Using the MAL signal on line 256 as the control input to multiplexer 212, the high speed section selects the maintain active VTS and sends it to the timing system in lieu of the VTS from sequence control memory 214 (illustrated by signal 916 in FIG. 9). This actually occurs on the next clock after the MAL signal is applied to multiplexer 212, when the maintain active VTS selects the values in period memory 218 and time value memory 216, which are loaded into holding registers 222 and 220, respectively (illustrated by signal 918 in FIG. 9).

The maintain active VTS information addresses the timing information selected by the user in time value memory 216 and period value memory 218. Once the timing values are in data holding registers 220 and 222, the system uses the MAL signal to disable the Tz signal to data holding registers 220 and 222. This freezes the content of the holding registers which are used by timing generator 224 and period generator 226 during the maintain active operation.

As can be seen in FIG. 9, a last test signal 906 is provided to the DUT during a test period beginning with Tz signal 922. On a subsequent test period, indicated by Tz signal 924, a maintain active sequence 926 is applied to the DUT instead. As can be seen, this system provides that there is no period in which a test signal is not applied to the DUT, with the maintain active test signal being applied immediately after the last test signal is applied.

Pattern memory 228 is not needed during maintain active mode, since the edges of the signal supplied to the DUT can be defined without using the pattern memory. The pattern memory is used to cause signal edge definitions to repeat, vary, etc. during a test. These capabilities are not needed to merely maintain signal stimulus.

Contrary to the situation when a test is in progress, during a maintain active operation, the CPU can access all the memories of high speed system 200. Hence, the CPU can load the information for a new test into sequence control memory 214, pattern memory 228, time value memory 216, and period value memory 218, as needed, via the CPU bus. The TBUSY signal normally inhibits the memory loading from the CPU when a test has started. Signals MAL or MAG override this function and allow memory loading from the CPU when they are active. The TBUSY signal on line 258 (signal 920 in FIG. 9) is used to switch over to the CPU bus and CPU clock (signal 930 in FIG. 9) after the maintain active VTS has been supplied to memorizes 216 and 218.

AND gates 240 and 242 ensure that TBUSY can be used to switch control to the CPU only when the MAL signal on line 256 is active (to prevent TBUSY from making a selection before MAL causes the maintain active VTS to be selected). During the maintain active operation, the TBUSY signal on line 258 is connected to a control input of multiplexer 230 to allow the CPU bus to address sequence control memory 214 and pattern memory 228. In addition, when the MAL signal is active, TBUSY controls multiplexers 232 and 234 to allow the CPU to address and deliver data to time value memory 216 and period value memory 218, and it controls multiplexers 236 and 238 to let the CPU clock strobe in the data present on the CPU bus.

Once the maintain active condition is no longer needed (when the CPU is ready to start a new test), the CPU sends a command for a new test start by asserting the start mode in mode register 206 (signal 1010 in FIG. 10). Upon receiving the start signal 260, global high speed control 208 deasserts the MAG signal on line 252, signaling the end of the maintain active operation (signal 1012 in FIG. 10). Instruction decoder 210 sends signals to replace the maintain active timing signals with the signals needed to run a regular test, including changing the Tz Type signal (signal 1014 in FIG. 10) to indicate an end of the maintain active mode. In response to the Tz Type signal, runtime timing circuit 204 deasserts the MAL signal (active low) on line 256 (signal 1016 in FIG. 10). The pattern and timing information used after the maintain active operation may be those of the existing test or the new test loaded in memory during the maintain active operation.

The maintain active code for the Tz Type signal acts as a synchronization signal to exit the maintain active mode. To synchronize the propagation of the necessary information to run a test throughout the system, first the MAL signal on line 256 is deasserted by runtime timing circuit 204 in response to the synchronization or resume signal, Tz Type. The MAL signal is provided to the control input of the multiplexer 212, so new VTS information from the sequence control memory 214 can propagate to the period and timing generators. Since the MAL signal on line 256 at the control input of multiplexers 232 through 238 is deasserted, the next Tz signal lets the timing information reach the memories (signal 1018) and then the holding registers 220 and 222 (signal 1020), and thus timing generator 224 and period generator 226. Upon the completion of these steps, the system is ready to perform functional testing in the normal manner. Once these steps are performed, global high speed section 208 generates the "RUN" signal on signal line 262 to start the test (signal 1022). In the next Tz period, maintain active test signals 926 are replaced by the new test signals 1026 as shown in FIG. 10. It should be stressed that the above process, i.e. entering the maintain active operation and exiting the operation, is done in a manner that is coherent and seamless. In the process, the DUT does not encounter any stolen clock cycles.

In an alternate embodiment, instead of storing the maintain active VTS in register 265, it can be a subroutine in sequence control memory 214. A Fail or Halt signal would cause this subroutine to be selected. An instruction with the address for this subroutine could be substituted for the address from sequence control memory 214 by using a multiplexer with an input connected to a register storing the subroutine address. This address is provided to instruction decoder 210, which selects the subroutine in sequence control memory 214. This would also eliminate the need for multiplexers 212, 232 and 233. Once the appropriate values are loaded into holding registers 220, 222, their inputs can be disabled using the MAL signal, and all of the memories can be updated by the CPU.

Pin Slice Architecture Maintain Active Implementation.

Figure 6:
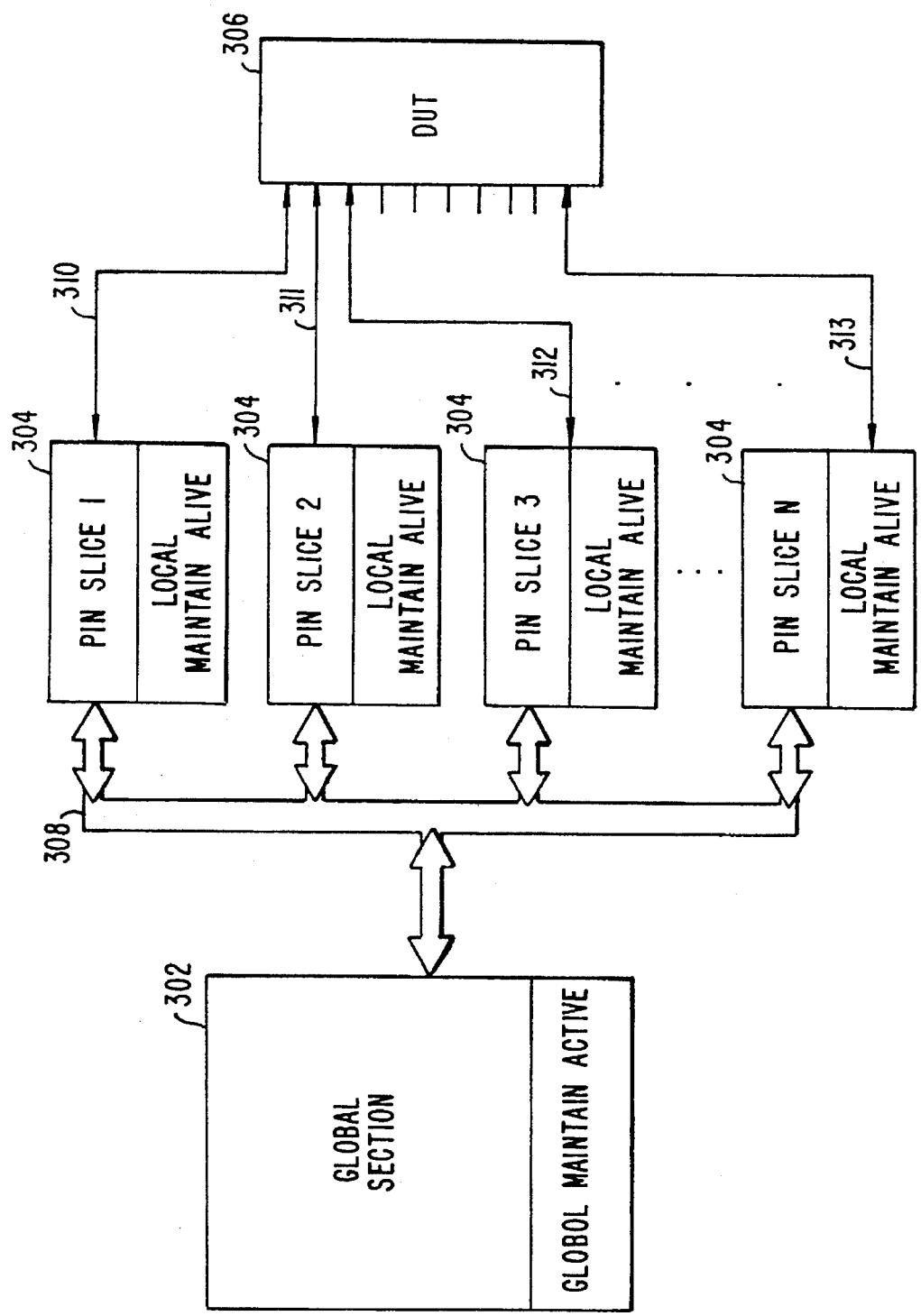
FIG. 6 is a block diagram of an ATE system with Pin Slice architecture incorporating the present invention.

FIG. 6 illustrates an ATE system 300 using Pin Slice architecture. This system uses an "event sequence" method to test the DUT. An "event" is a pair (S, T) where "S" is a state and "T" is the time associated with the transition to S. An "event sequence" is a time-ordered list of such pairs. The system is modified to incorporate the present invention. It should be noted that the necessary CPU and other parts of a tester system are not reflected in FIG. 6. What is shown are the required modules of a tester system to practice the teaching of the present invention.

FIG. 6 shows a global section 302, "N" Pin Slice (PS) sections 304, and DUT 306. The number "N" is determined by the number of pins a DUT has, since for every pin being tested, one Pin Slice section is needed. Global section 302 generates the global signals used by the rest of the system. For example, global module 302 generates certain global signals upon receiving an indication that a test has stopped. The conditions that result in stopping a test are the same as those listed before. Global module 302 also generates the maintain active signals used by the maintain active portion of the individual PS modules 304. The "global signals" are communicated to PS sections 304 via signal lines 308. Pin slice sections 304 use the global signals to provide the maintain active sequence to the DUT 306 via signal lines 310–313.

Figure 7:
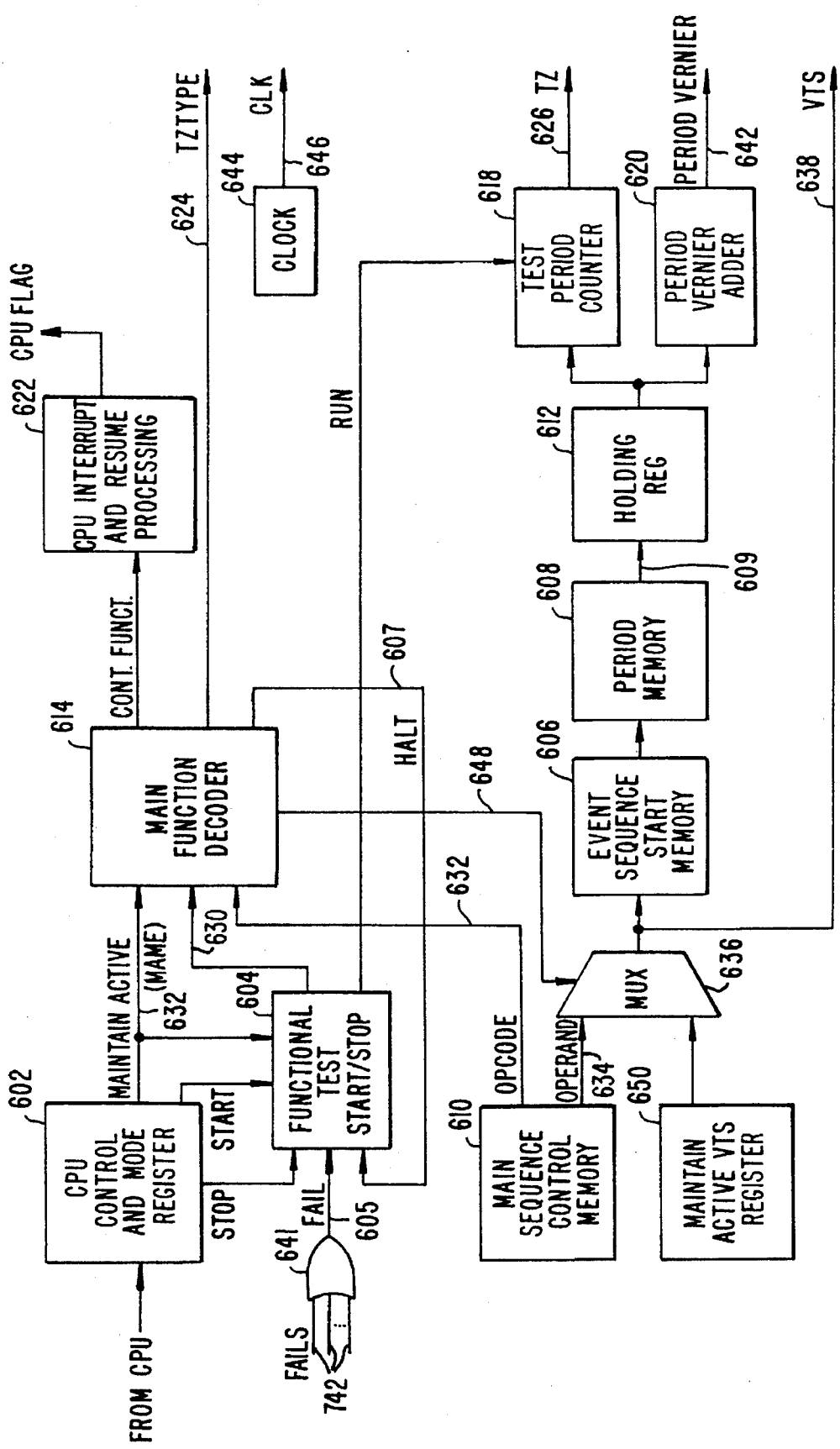
FIG. 7 is a block diagram of the global section of FIG. 6.
Figure 8:
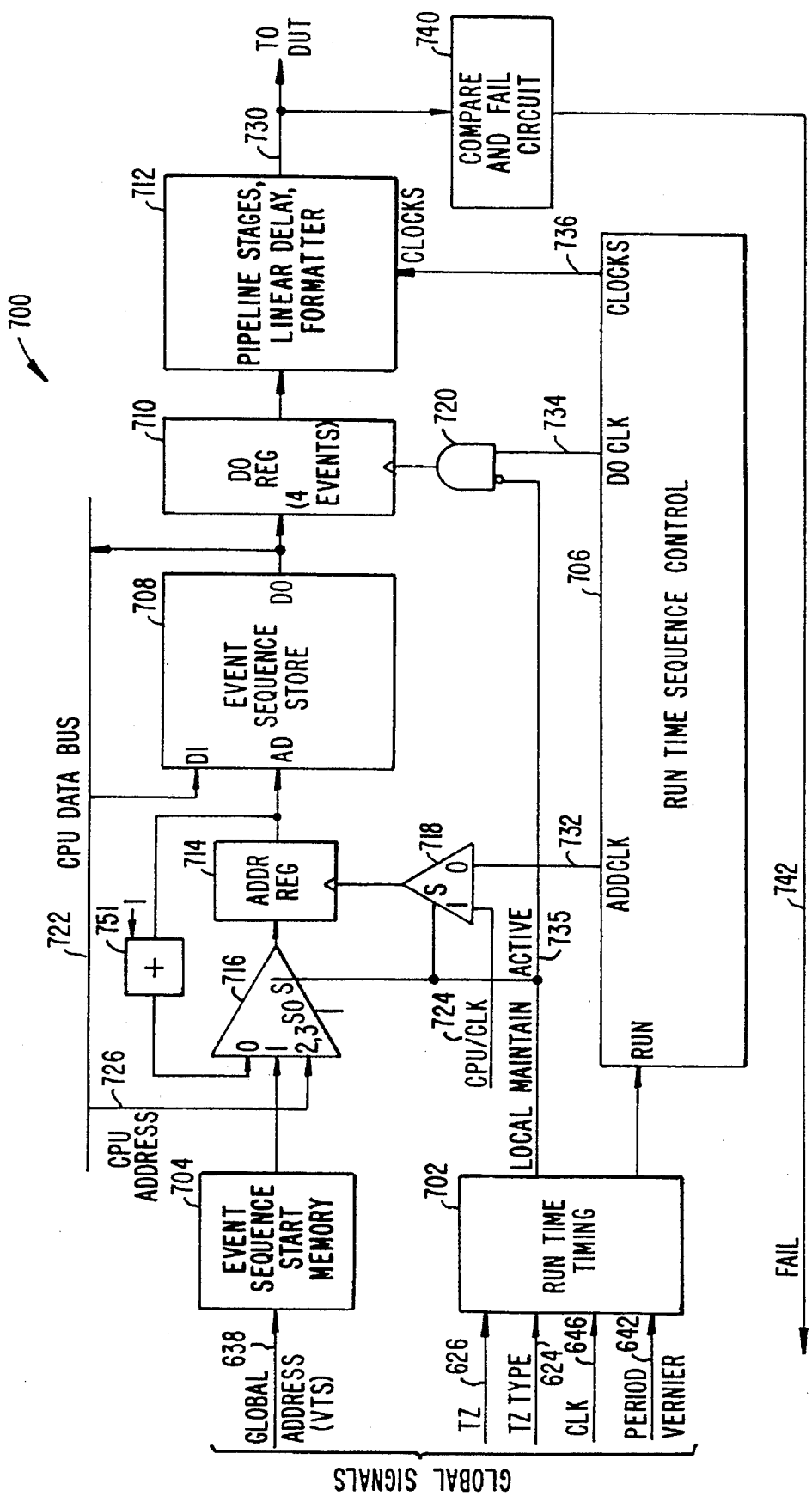
FIG. 8 is a block diagram of one Pin Slice section of FIG. 6.

FIGS. 7 and 8 illustrate an embodiment of Global Module 302 and Pin slice module 304, respectively, including the maintain active capability. During normal operation of the tester, a main sequence control memory 610 stores a test sequence. This memory is sequentially addressed by circuitry not shown to generate OP codes provided on bus 632 to decoder 614. In addition, the memory provides a vector-type select (VTS) signal on bus 634 through a multiplexer 636 to both an event sequence start memory 606 and a bus 638 which is provided to the individual pin slice circuit of FIG. 8.

The OP code on line 632 will cause decoder 614 to provide a normal test signal as Tz type on line 624. The operand on bus 634 will select a memory location in memory 606 which will provide an appropriate memory address for period memory 608 which will define the global period for the test. This is done with an output signal on line 609 provided to a holding register 612. The holding register 612 value is provided to both test period counter 618 and period vernier adder 620. Test period counter 618 provides a time zero (TZ) signal on line 626 which indicates the start of a global test. Vernier adder 620 provides a period vernier value on a line 642 which essentially provides an offset from the Tz signal to allow variations of the global period.

Referring to FIG. 8, the global VTS signal on line 638 is provided to an event sequence start memory 704. A stored address in this memory is output through a multiplexer 716 to an address register 714, where it addresses an event sequence store memory 708. A plus one adder 751, connected between the output of address register 714 and an input of multiplexer 716, can be used to sequence through a series of addresses. The event sequence store memory 708 can be programmed differently for every pin slice, with the memory location address storing something different for each pin slice (memory 704, and memory 606 of FIG. 7, both provide additional flexibility for indirect addressing, but could be eliminated for another embodiment). The particular data for the pin slice is provided to a data out register 710, which is interpreted by formatter 712 to provide the particular described waveform to the device under test on line 730.

The Tz, Tz type, CLK and period vernier signals on lines 626, 624, 646 and 642 from the global module of FIG. 7 are provided to runtime timing circuit 702 of FIG. 8. During the normal running of a test, runtime timing circuit 702 provides a signal to a runtime sequence control circuit 706, which provides an address clock output on line 732 through multiplexer 718 to address register 714. In addition, it provides a data out clock on a line 734 through an AND gate 720 to data out register 710. Additionally, it provides clock signals on lines 736 to formatter circuitry 712.

In the embodiment of FIG. 7, a mode bit "maintain active" is written by the CPU (not shown here) into CPU control and mode register 602. This mode bit is the same as the MAME bit written in mode register 206 of FIG. 5. This mode bit modifies the behavior of the circuit in FIG. 7 when a stop occurs. When this bit is asserted it is applied to Functional Test Start/Stop module 604 and to Main Function Decoder 614. When start/stop module 604 detects a Fail or Halt signal on lines 605 or 607, respectively, for the reasons outlined before, it generates a maintain active signal on line 630 to Main Function Decoder 614. The Fail signal originates from a pin slice section, such as shown in FIG. 8, where a compare and fail circuit 740 connected to the DUT generates a Fail signal on line 742. FIG. 7 shows a series of lines 742 ORed together in an OR gate 641 to provided a Fail signal on line 605.

Decoder 614 responds to the maintain active signal on line 230, if the MAME bit on line 632 is activated, by changing the Tz type signal on line 624 to indicate a maintain active mode. In addition, a maintain active select signal on a line 648 is provided by decoder 614 to multiplexer 636. Multiplexer 636, in response to the signal, will select a VTS value from a maintain active VTS register 650 instead of from Main Sequence Control Memory 610. This is a pre-stored, predetermined VTS for use during the maintain active mode on line 638. It addresses the Event Sequence Start Memories in both the global section (FIG. 7, 606) and the pin slices (FIG. 8, 704).

Memory 606 addresses the Period Memory 608, which delivers the maintain active period value via bus 609 to holding register 612, where it is stored for the duration of the maintain active mode and applied repeatedly to test period counter 618 and period vernier adder 620. As a result, maintain active Tz and period vernier signals are provided on lines 626 and 642.

Turning to FIG. 8, in a maintain active state, the VTS signal line 638 will select in memory 704 the location storing the address of the maintain active sequence. This address is provided through multiplexer 716 to address register 714, where it will address the maintain active sequence in event sequence store 708. The sequence at this location is then provided to data out register 710, where it can be applied to formatter 712 for providing the signals to the DUT.

When runtime timing circuit 702 receives the Tz type signal indicating the maintain active mode, it will generate a local maintain active signal on line 735 sometime thereafter as indicated by the Tz signal on line 626 during the maintain active mode. This signal will cause multiplexer 716 to select input 726, coupled to the CPU bus, allowing the CPU to address the event sequence store memory 708. The signal is delayed to allow the maintain active address to pass through the multiplexer to the event sequence store 708 first. A local maintain active signal also will disable AND gate 720 to prevent further clocking of data out register 710 so that the signals on the output of event sequence store 708 can change without affecting the maintain active sequence in the data out register. Thus, the CPU can provide on data bus 722 new data to be written into event sequence store memory 708 without affecting the maintain active sequence being provided to the DUT.

The desired timing for the maintain active sequence is provided using the Tz and period vernier values in a global module as defined by the holding register 612 of FIG. 7, with this timing being provided to runtime sequence control circuit 706, which can then provide the clocks on line 736 to formatter 712.

In an alternate embodiment, instead of using a special maintain active period in register 650 of FIG. 7 and designated maintain active sequence in memory 708 of FIG. 8, the system can just use the last period in sequence run on the test and keep repeating this to the DUT during the maintain active period. This would eliminate the need for the special registers or addressing a special location in memory.

While the maintain active operation is going on, the local maintain active signal is used to select the CPU address lines and the CPU clock input for addressing ESS 708 as discussed above. This enables the CPU to address ESS 708 through the address register 714 via address bus 726 and reload ESS 708 with a new test sequence using the CPU data bus 722 if such action is desired. The user determines whether a new test must be loaded in the memory while in maintain active mode. If a new test is not loaded in the memory, the system resumes the test using the existing information in the memory. For example, if a failure occurs, the system may or may not load a new test in the memory.

The CPU can also reload the various memories in the global module of FIG. 7, such as main sequence control memory 610, event sequence start memory 606 and period memory 608. Once the CPU has loaded the memories it desires, or has examined the fail and decided to continue testing after a maintain active mode, the tester will sequence back into a test mode.

The CPU will write a bit into mode register 602 indicating that a test should restart when the test system is in a maintain active mode. This is communicated to start/stop module 604, which provides a signal to decoder 614 on line 630 indicating that a maintain active mode should be exited. Decoder 614 then changes the Tz type signal on line 624 to indicate that testing should resume, and provides a signal on line 648 to switch multiplexer 636 back to taking inputs from main sequence control memory 610. The new test period from memory 608 is provided to holding register 612 and from there to test period counter 618 in period vernier adder 620 to provide a new Tz and period vernier value. The new VTS signal is provided through multiplexer 636 from main sequence control memory 610.

Referring to FIG. 8, on the restart of the test, the new VTS signal on line 638 is provided through event sequence start memory 704 to multiplexer 716. The Tz type signal provided to runtime timing circuit 702 deasserts the local maintain active signal on line 735, switching multiplexer 716 back to selecting the input from event sequence start memory 704. This address can then be provided through address register 714 to event sequence store memory 708, and from there to data out register 710. Since the local maintain active signal has been removed, AND gate 720 no longer inhibits the clock signal, and the timing on the clock signal, as provided by a new Tz and period vernier value, is provided through runtime timing circuit 702 to runtime sequence control circuit 706. Again, the process of entering the maintain active operation and exiting the operation is done in a manner that is coherent and seamless.

The method and apparatus of the present invention can equally apply to situations where a device using a PLL is being tested. The presence of a continuous stimulus prevents the drifting of a PLL frequency, preventing the PLL from losing the lock on the input frequency.

A method and an apparatus for maintaining stimulus to a DUT after a test is stopped has now been explained with reference to specific embodiments. Other embodiments will be apparent to those of ordinary skill in the art. It is therefore not intended that this invention be limited except as indicated by the appended claims.

We claim:

1. In a tester system for providing input test signal stimulus to a device under test ("DUT"), a method for maintaining stimulus to said DUT after a test stops, comprising the steps of:

detecting a stop signal indicating the stopping of said test, said stop signal including one of a test failure, test halt and test completion signal;

providing, from said tester system, a maintain active signal stimulus stored in a memory to said DUT upon said detecting said stop signal; and synchronously replacing said maintain active signal stimulus with an input test signal stimulus upon the detection of a resume signal indicating that testing is to resume.

2. The method of claim 1, further comprising the steps of detecting a signal indicating when said tester system is ready to resume testing, and generating said resume signal.

3. The method of claim 2, further comprising the step of detecting whether a maintain active operation enable signal is asserted, and only providing said maintain active signal stimulus if the stopping of said test is detected and said maintain active operation enable signal is asserted.

4. The method of claim 3, further comprising the steps of:
   storing new test vectors in a memory while said maintain active signal stimulus is being provided to said DUT; and
   providing a new test signal stimulus indicated by said new test vectors to said DUT after said resume signal is detected.

5. The method of claim 4 wherein said storing step further comprises the steps of:
   coupling the address inputs of said memory to a CPU address bus;
   coupling the data inputs of said memory to a CPU data bus; and
   coupling a clock input of said memory to a CPU clock signal.

6. The method of claim 5 wherein each of said coupling steps comprises switching a multiplexer.

7. The method of claim 1 further comprising the steps of:
   storing a representation of said maintain active signal stimulus in a predetermined memory location; and
   accessing said predetermined memory location upon said detecting the stopping of said test.

8. The method of claim 7 wherein a different maintain active signal stimulus is separately stored in a plurality of pin slice memories and provided to each pin of the DUT, and a global maintain active period is generated to cause said different maintain active signal stimulus to be provided to said DUT.

9. The method of claim 8 further comprising the step of transferring said representation of said maintain active signal stimulus from said pin slice memories to a plurality of pin slice registers.

10. The method of claim 1 wherein a signal stimulus of said test is used as said maintain active signal stimulus.

11. The method of claim 1, further comprising the step of stopping said test when said DUT fails said test.

12. The method of claim 1, further comprising the step of stopping said test when said test is completed.

13. The method of claim 1, further comprising the step of stopping said test when a programmed halt is executed by said system.

14. The method of claim 1, wherein said maintain active signal stimulus is applied to each pin of said DUT.

15. The method of claim 1, wherein said maintain active signal stimulus is applied to one pin of said DUT.

16. The method of claim 1 wherein said memory is a register.

17. The method of claim 7 wherein said predetermined memory location is a register.

18. The method of claim 1, wherein a separate maintain active signal is generated for every pin of said DUT.

19. In a tester system for providing input test signal stimulus to a device under test ("DUT"), an improvement for maintaining stimulus to said DUT after a test stops, comprising:
   means for detecting a stop signal indicating the stopping of said test, said stop signal including one of a test failure, test halt and test completion signal;
   means for providing a maintain active signal stimulus stored in a register to said DUT upon said detecting the stopping of said test; and
   means for synchronously replacing said maintain active signal stimulus with a test signal stimulus upon the detection of a resume signal.

20. The improvement of claim 19, further comprising means for detecting when said system is ready to resume testing, and generating said resume signal.

21. The improvement of claim 20, further comprising means for determining whether a maintain active operation enable is asserted before providing said maintain active signal stimulus if the stopping of said test is detected.

22. The improvement of claim 21, further comprising means for providing said test signal stimulus to said DUT after said synchronization signal is detected and said maintain active signal stimulus is removed.

23. The improvement of claim 21, further comprising:
   means for storing a new test signal stimulus while said maintain active signal stimulus is being provided to said DUT; and
   means for providing said new test signal stimulus to said DUT after said synchronization signal is detected and said maintain active signal stimulus is removed.

24. The improvement of claim 19 wherein said tester system includes a pipeline of clocked stages for providing said test signal stimulus to said DUT, said improvement further comprising:
   means for causing said test signal stimulus to propagate through said pipeline responsive to a resume test signal; and
   means for generating said synchronization signal when said test signal stimulus has propagated through said pipeline.

25. The improvement of claim 24 wherein said pipeline includes:
   a vector type select memory; and
   an event sequence store memory coupled to an output of said vector type select memory.

26. The improvement of claim 25 further comprising:
   an address register coupled between said vector type select memory and said event sequence store memory; and
   a multiplexer having an output coupled to said address register, a first input coupled to a test clock and a second input coupled to a CPU clock.

27. The method of claim 3, further comprising the steps of:
   storing new test information in a memory in said tester system comprising at least one of sequence control information, pattern information, time value information and period value information, while said maintain active signal stimulus is being provided to said DUT; and
   providing a new test signal stimulus indicated by said new test vectors to said DUT after said resume signal is detected.

* * * * *